United States Patent [19]
Stephens, Jr. et al.

[11] Patent Number: 5,550,500
[45] Date of Patent: Aug. 27, 1996

[54] TIMING DELAY MODULATION SCHEME FOR INTEGRATED CIRCUITS

[75] Inventors: Michael C. Stephens, Jr.; Ajit K. Medhekar, both of San Jose, Calif.

[73] Assignee: Alliance Semiconductor Corporation, San Jose, Calif.

[21] Appl. No.: 493,901

[22] Filed: Jun. 23, 1995

[51] Int. Cl.⁶ .............................. H03K 5/13; H03K 5/153
[52] U.S. Cl. .............................. 327/261; 327/172; 327/77
[58] Field of Search ................................. 327/261, 263, 327/269, 270, 272, 172-14 176, 276, 77, 408

[56] References Cited

U.S. PATENT DOCUMENTS

| | | | |
|---|---|---|---|
| 4,820,943 | 4/1989 | Makino et al. | 327/269 |
| 5,068,553 | 11/1991 | Love | 327/288 |
| 5,083,045 | 1/1992 | Yim et al. | 307/350 |
| 5,097,146 | 3/1992 | Kowalski et al. | 327/77 |
| 5,118,968 | 6/1992 | Douglas et al. | 307/362 |
| 5,376,829 | 12/1994 | Rogers et al. | 327/408 |
| 5,426,390 | 6/1995 | Yabe et al. | 327/270 |
| 5,440,260 | 8/1995 | Hayashi et al. | 327/278 |
| 5,446,321 | 8/1995 | Yoshino et al. | 327/408 |

FOREIGN PATENT DOCUMENTS

| | | | |
|---|---|---|---|
| 1166219 | 7/1986 | Japan . | |
| 6045889 | 2/1994 | Japan | 327/261 |

Primary Examiner—Timothy P. Callahan
Assistant Examiner—Eunja Shin
Attorney, Agent, or Firm—Bradley T. Sako

[57] ABSTRACT

A timing delay modulation scheme for integrated circuits (10) is disclosed. A super voltage is applied to existing bond pads (30) and detected by super voltage detect circuits (34) which generate a number of logic input signals (22) to a logic unit (18). In response, the logic unit (18) provides a number of control signals (24) which are coupled to timing adjust circuits (20). In the preferred embodiment, in response to its respective control signals, each timing adjust circuit (20) pushes-out or pulls-in, a separate internal timing signal (S0–S3) of the integrated circuit. The super voltage detect circuit (34) includes an adjustable effective super voltage level, and is capable of being disabled. Further, the timing adjustment provided by each timing adjust circuit (20) can be altered.

23 Claims, 3 Drawing Sheets

TIMING DELAY MODULATION SCHEME FOR INTEGRATED CIRCUITS

TECHNICAL FIELD

The present invention relates generally to the internal timing of integrated circuits, and more particularly to methods of adjusting the internal timing signals of an integrated circuit at both the wafer level and once in packaged form.

BACKGROUND OF THE INVENTION

Integrated circuits commonly include multiple timing signals that must operate in conjunction with one another to ensure that the integrated circuit operates properly. An example of such timing signals is set forth in commonly-owned, copending U.S. patent application Ser. No. 423,822, entitled SYNCHRONOUS SRAM HAVING ASYNCHRONOUS TEST MODE, incorporated by reference herein.

To optimize the performance of the internal timing of an integrated circuit, it is known to provide a number of interconnection schemes (often called "metallization options"), wherein each scheme provides a different timing variation for the circuit. Such interconnection schemes can be time intensive and expensive to implement, requiring a new circuit fabrication mask. In addition, according to such an approach, once the integrated circuit is packaged, no further timing adjustments can take place.

It is also known to alter the internal timing of an integrated circuit by providing a number of laser fusible links. By opening the links, delays are introduced into the internal timing of the device. Such timing alteration schemes are irreversible, however, and typically leave no room for testing other delay variations. In addition, like the alternate metallization schemes described above, once the integrated circuit is packaged, no further timing adjustments can take place.

U.S. Pat. No. 5,351,211 issued to Higeta et al. on Sep. 27, 1994, discloses a semiconductor integrated circuit having an internal delay element that is used for determining the timing parameters of a RAM and/or logic portion of the circuit. The circuit includes input and output latching circuits that are controlled by a clock signal. The clock signal that is used to activate the input latching circuit is delayed by an internal delay element, and the delayed clock signal is then used to activate an output latching circuit. The delay element can also be switched into a ring oscillator-type circuit. When optimal latching operation is achieved (indicating a certain inherent delay in the RAM and/or logic circuit), the oscillation frequency of the ring oscillator is used as a measure of the inherent delay. The delay element of Higeta et al. is programmable. By providing an input signal, TST, a variety of delay times for the delay element can be achieved. While Higeta et al. provides a method of measuring the overall speed of a RAM and/or logic circuit, there are no teachings on altering the actual internal timing signals of the circuit under test. In addition, the delay element illustrated in Higeta et al. requires a large number of inputs, requiring the circuit to include a serial input circuit or a large number of external inputs.

U.S. Pat. No. 5,389,828 issued to Shusei Tago on Feb. 14, 1995, discloses a programmable pulse delay generator for precisely adjusting the width of a pulse. The Tago patent utilizes a digital-to-analog converter that require a large number digital input signals and circuit elements.

U.S. Pat. No. 5,124,589 issued to Shiomi et al. on Jun. 23, 1992, discloses a self-timed random access memory (RAM) having clocked input and output data retain circuits that can be disabled (i.e., made functionally transparent) by the application of a voltage greater than an external clock voltage (a "super voltage"). Shiomi et al. has no teachings on altering the timing internal to the RAM.

U.S. Pat. No. 5,212,442 issued to O'Toole et al. on May 18, 1993, discloses a method and apparatus for altering the substrate biasing of a packaged integrated circuit. One embodiment illustrates a super voltage detect circuit coupled to a bond pad of the device that is used to adjust the substrate bias.

It would be desirable to provide an integrated circuit wherein multiple internal timing signals could be varied by an external signal after the integrated circuit is packaged. It would further be desirable to provide an integrated circuit wherein the internal timing signals could be adjusted without requiring a large number of input signals.

SUMMARY OF THE INVENTION

It is an object of the present invention to provide an integrated circuit (IC) having internal timing signals that can be varied after the IC is packaged.

It is another object of the present invention to provide an IC having multiple internal timing signals where the edges of the signals can be pushed-out, or pulled-in, according to external input signals.

It is another object of the present invention to provide an IC having internal timing signals that can be adjusted at the wafer level.

It is another object of the present invention to provide an IC having internal timing signals that can be adjusted once the IC is in packaged form.

According to a preferred embodiment of the present invention, an integrated circuit having multiple internal timing signals includes a number of signal timing adjust circuits for modifying the internal timing signals. Each signal timing adjust circuit is controlled by one or more control signals. The control signals are provided by a logic circuit in response to a number of external adjustment signals.

According to an aspect of the present invention the logic circuit is a decoder circuit that provides one particular control signal in response to one combination of external adjustment signals.

According to another aspect of the present invention the external adjusting signals are generated by applying a super voltage to one or more bond pads on the IC.

An advantage of the present invention is that a number of internal timing signals of an IC can be varied prior to any permanent internal timing adjustment.

Yet another advantage of the present invention is that a number of internal signals can be varied without requiring a large number of external inputs.

Yet another advantage of the present invention is that it provides an IC having internal timing that is varied by the application of a super "voltage above a certain activation voltage level, wherein the activation voltage level is" adjustable.

Other objects and advantages of the invention will become apparent in light of the following description thereof.

DETAILED DESCRIPTION OF THE EMBODIMENTS

Figure 1:
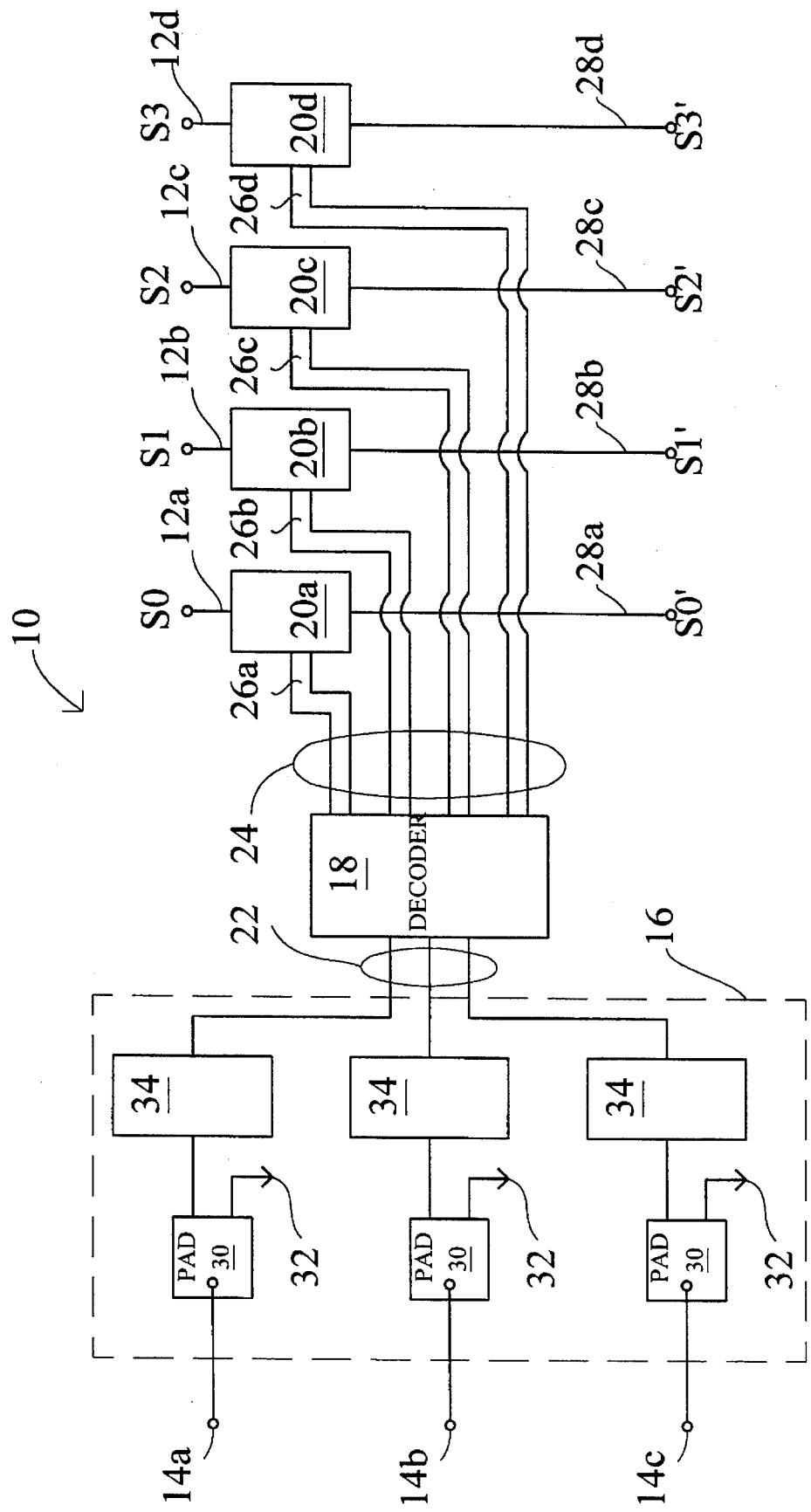
FIG. 1 is a block schematic diagram illustrating a timing delay modulation circuit according to the preferred embodiment of the present invention.

FIG. 1 illustrates, generally, a timing delay modulation circuit 10 according to the preferred embodiment of the present invention. It is understood that the preferred embodiment is intended to form a portion of a larger integrated circuit device. The preferred embodiment receives four internal timing signals (S0–S3) on four signal input lines (12a–12d). According to the logic provided by three external input lines (14a–14c), the internal timing signals (S0–S3) are varied to provide four modified internal timing signals (S0'–S3').

As set forth in FIG. 1, the preferred embodiment includes an input circuit 16, a logic circuit 18, and one timing adjust circuit (20a–20d) for each internal timing signal (S0–S3). The input circuit 16 receives the three external input signals (14a–14c) and provides three corresponding logic input signals 22 to the logic circuit 18. The logic circuit 18, in response to the logic input signals 22, generates a logic high at selected control lines 24. As shown in the figure, each timing adjust circuit 20 receives a control line pair (26a–26d). In response to the logic of its respective control line pair 26, the timing adjust circuit alters the control pulse signal it receives to provide the modified internal timing signals (S0'–S3') on four output lines (28a–28d). The modified internal timing signals are used to control other portions of the integrated circuit device.

In the preferred embodiment, the external input signals 14 are provided either by probes, when the device is at the wafer level, or by external package leads after the device is packaged. Accordingly, the external input signals 14 are each received on a bond pad 30. In the preferred embodiment, the bond pads are "dual-purpose" to the extent that the bond pads 30 used in the input circuit 16, are also connected to other portions of the integrated circuit device (not shown) by alternate lines 32. The bond pads 30 are selected to be device inputs or outputs that are not critical to testing the internal timing of the device. As just one example, in a preferred embodiment, the device is a random access memory (RAM) in which the data are typically read and written in 32-bit "double words." The bond pads 30 used to pass the external input signals 14 in this particular embodiment, are also used to pass byte write enable signals (typically disabled) for the writing of individual eight-bit words to the RAM.

Referring once again to FIG. 1, it is shown that a super voltage detect circuit 34 is coupled to each bond pad 30. Each super voltage detect circuit 34 provides a logic input signal 22 when a super voltage is applied to its respective bond pad 30. As used herein, the term "super voltage" is a voltage that is higher than the logic "high" level of the rest of the preferred embodiment. The super voltage detect circuits 34 serve to differentiate the operation of the preferred embodiment from the other circuits of the device, enabling the device to be tested in packaged form, and without requiring any additional input bond pads.

Figure 2:
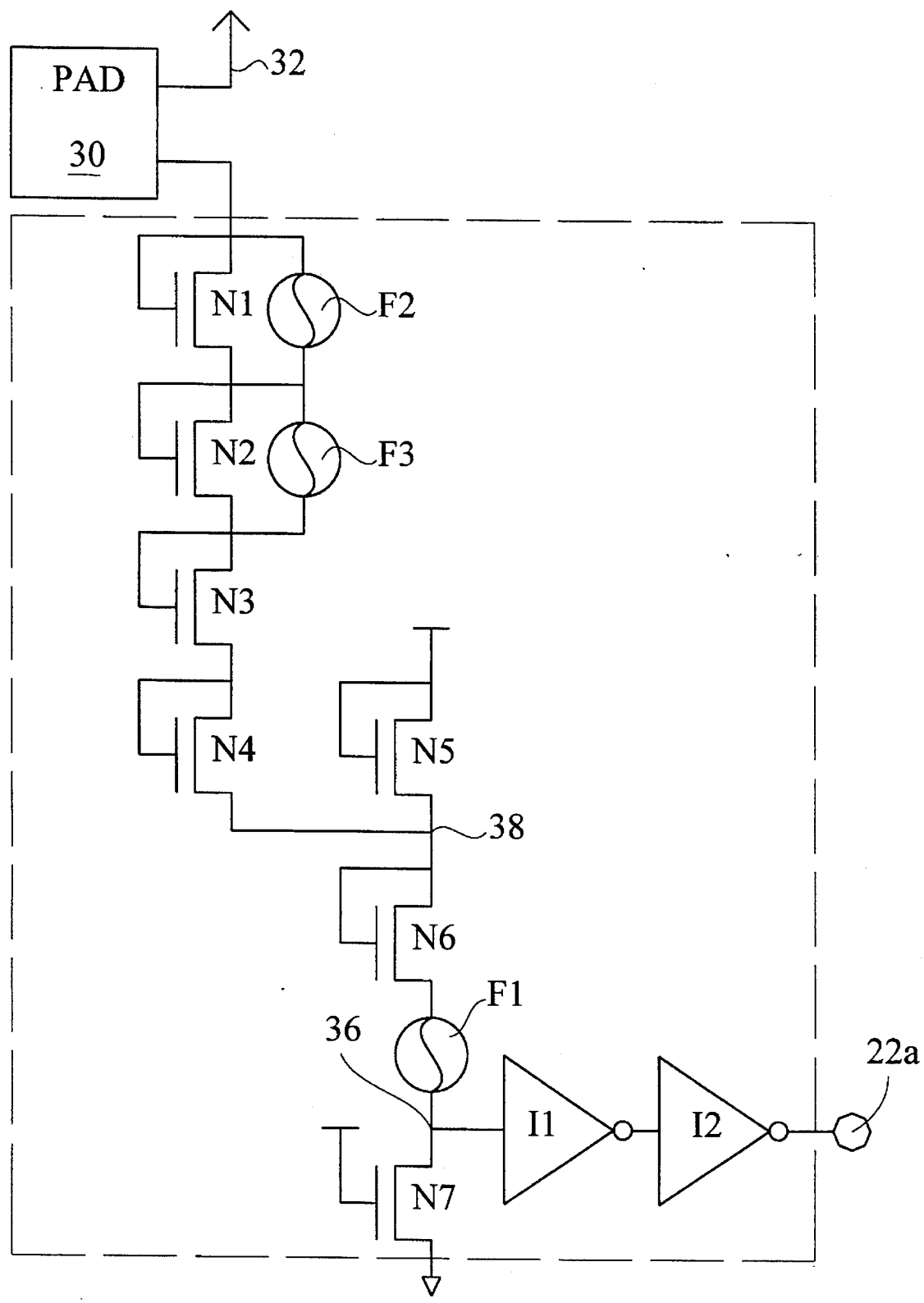
FIG. 2 is a schematic diagram illustrating the super voltage detect circuit according to the preferred embodiment of the present invention.

Referring now to FIG. 2, the super voltage detect circuit 34 of the preferred embodiment is set forth in detail. The super voltage detect circuit 34 is shown to includes six diode connected NMOS transistors (shown as N1–N6), as well as an NMOS pull-down transistor N7. N1 through N4 are connected in series, with the drain of N1 coupled to the respective bond pad 30 of the super voltage detect circuit 34. The source of N4 is coupled to the source of N5 and the drain of N6. N5 is coupled to the positive power supply and N6 is coupled, via a fusible link (F1), to the drain of N7. N7 is coupled by its source to ground and by its gate to the positive power supply. As shown in the figure, the drain of N7 is a detect node 36. The logic of the detect node 36 is driven by two series inverters (I1 and I2) to provide one of the logic input signals 22 to the logic unit 18.

In its "quiescent" state (i.e. no super voltage applied to its respective bond pad 30) the super voltage detect circuit 34 provides a low logic input signal 22 to the logic unit 18. This creates a default state for the timing delay modulation circuit 10 in which there is no adjustment to the internal timing signals (S0–S4) absent an external input signal (14a–14c). In the preferred embodiment, this is accomplished by the operation of N5 –N7 and F1. In the quiescent state, N7 is turned on, with N5 and N6 serving as load elements. A quiescent state reference voltage is developed at the source of N5 (node 38). This voltage is dependent upon the relative width/length ratios (W/L) of N5, N6, and N7, as well as the resistance of F1. In the preferred embodiment, the relative W/L ratios of N5 and N6 are such that a quiescent state reference voltage at node 38 is approximately 1.4 volts, with a positive supply voltage of 3.3 volts. In addition, I1 is a CMOS inverter having relative PMOS and NMOS W/Ls that place the I1 switching voltage above the voltage at node 36 in the quiescent state.

In the preferred embodiment, the magnitude of the super voltage required to generate a high logic input signal 22 is determined by the operation of N1–N4. In order to generate a high-enough logic signal at the detect node 38, the equivalent diodes of N1–N4 must be turned on, and their W/Ls large enough to overpower N7. The present invention is intended to provide variability in the super voltage detect circuit 34. Referring once again to FIG. 2 it is shown that the super voltage detect circuit 34 includes two fusible links, F2 and F3, that are placed in parallel with N1 and N2, respectively. One or both of these fuses can be opened to raise the effective super voltage (the voltage required to generate a logic input signal 22). In addition, in the event that any of the super voltage circuits 34 are no longer needed, F1 can be opened, disabling the super voltage circuit 34 in its entirety. In such a case N7 will maintain the detect node 36 at a logic low level without drawing any quiescent current. This is particularly advantageous for minimizing power consumption. Accordingly, fuses F1–F3 provide a first level of variability in the operation of the present invention. In the preferred embodiment, F1–F3 are laser fusible links that must be opened prior to packaging the device. One skilled the art would recognize that this arrangement is particularly advantageous to a device having more than one possible operating voltage. In the preferred embodiment, the required super voltage with F2 and F3 in tact is approximately 10 volts, for a positive supply voltage of 3.3 volts and under typical (i.e. room temperature) operating conditions.

Referring once again to FIG. 1, it is recalled that absent a super voltage external input signal 14, the super voltage detect circuit 34 will be in its quiescent state and all of logic input signals 22 will be low. In the preferred embodiment, the logic circuit 18 is a three-into-eight decoder that maintains all of the control lines 24 in a low logic state in the event all logic input signals 22 are low. It follows that each different combination of super voltages at the bond pads 30 results in a different control line 24 going high. In this manner a large number of timing control signals (seven), as well as a quiescent state signal, are provided by a relatively small number of input signals (three). Further, by providing the input signals via a super voltage at a dual-purpose bond pads 30, no additional bond pads are required. One skilled the art would recognize that the selection of a decoder as the logic circuit 18 should not necessarily be construed as limiting. As just one example, a logic circuit 18 that provides a combination of control line 24 voltages in response to various logic input signals 22 could be provided.

Figure 3:
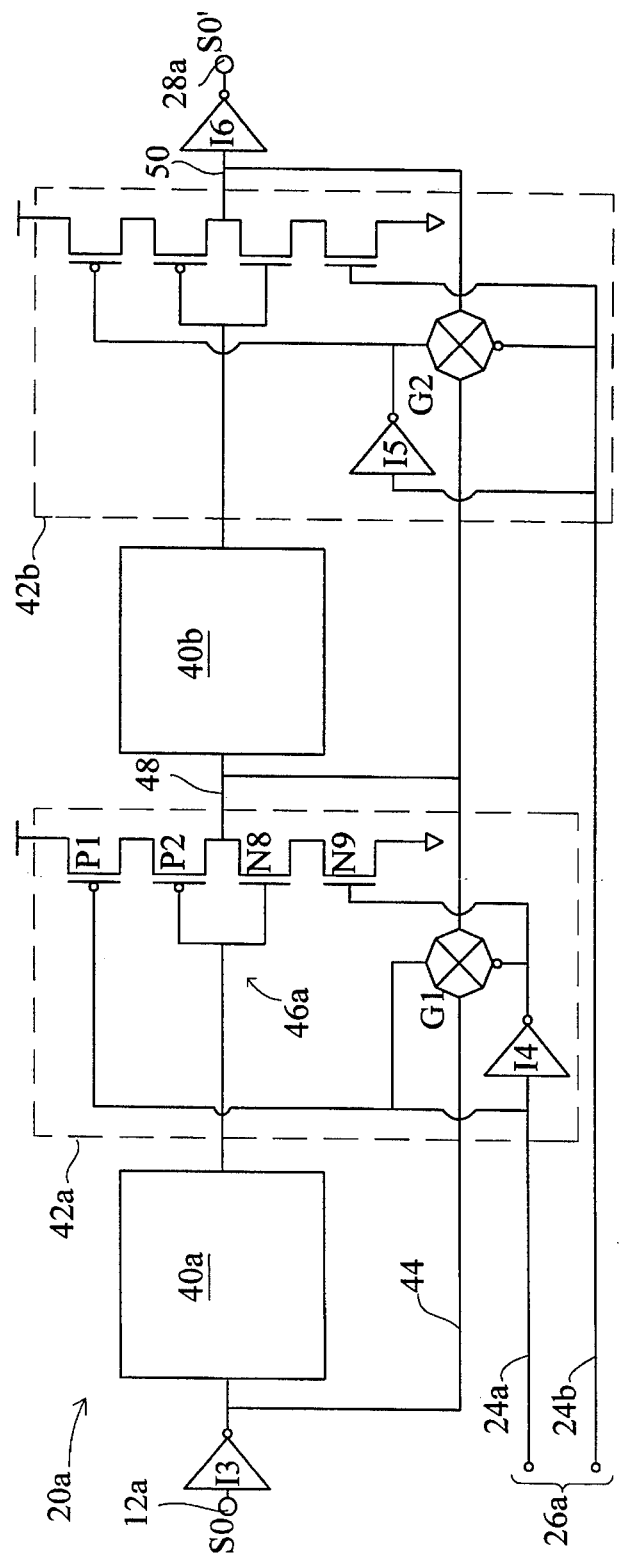
FIG. 3 is a block schematic diagram illustrating the pulse width adjustment circuit according to the preferred embodiment of the present invention.

Referring now to FIG. 3, the timing adjust circuit 20a of the preferred embodiment is set forth in detail. The timing adjust circuit 20a includes an input inverter I3, a first delay circuit 40a, a first gating section 42a, a second delay circuit 40b, and a second gating section 42b. As was previously described in FIG. 1, the timing adjust circuit 20a receives the internal timing signal S0 on the signal input line 12a. S0 is received by driver I3, which provides an inverted S0 signal to both the first delay circuit 40a and a bypass signal path 44. The first delay circuit 40a alters and inverts the signal it receives. In this manner two signals are provided to the first gating section 42a; an altered S0 via the first delay circuit 40a, and an inverted, but otherwise unaltered S0 via the bypass signal path 44.

The first gating section 42a can be conceptualized as a two-into-one multiplexer that allows either the altered S0, or inverted, unaltered S0 to pass therethrough, depending upon the logic state of the first control line 24a. In the preferred embodiment, the first gating section 42a includes a first tri-state driver 46a situated between the first delay circuit 40a and a center node 48, and a first passgate (G1) situated between the bypass signal path 44 and the center node 48. Both G1 and the first tri-state driver 46a are driven by the first control line 24a. When the first control line 24a is high, G1 is open, allowing the inverted S0 to pass through to the center node 48. At the same time, the first tri-state driver 46a is placed into the third (disabled) state, preventing the altered S0 from passing through to center node 48. Conversely, when the first control line 24a is low, G1 turned off and the tri-state driver 46a is enabled, allowing the altered S0 to pass through to the center node 48.

In the preferred embodiment, the operation of the second delay circuit 40b and gating section 42b is generally the same as that of the first (40a and 42b). According to the logic level at a second control line 24b, the signal at center node 48 is passed through to an output node 50, either unaltered, through a second passgate G2, or altered through the second delay circuit 40b and a second tri-state driver 46b. An output driver I6 drives the resulting signal.

In the preferred embodiment, as will be discussed below, the delay circuits (40a and 40b) function to increase or decrease a set delay of S0 by pushing-out, or pulling-in, the edges of S0. It is noted that the control logic created by inverter I5 is opposite to that created by I4, so that when the both control lines (24a and 24b) are low (which corresponds to no supervoltage at any bond pad 30), the edges of S0 are pushed out by the first delay circuit 40a. Accordingly, by bringing the first control line 24a high (by some combination of supervoltage(s) at the bond pads 30) the S0 edges are pulled in. In a similar fashion, when the second control line 24b is low, the second delay circuit 40b is bypassed. When the second control line 24b is brought high, G2 is turned off, and the edges of S0 are pushed out. In this manner the critical timing parameters of S0–S3 can be altered to test, optimize, or otherwise change the operation of the device.

Figure 4:
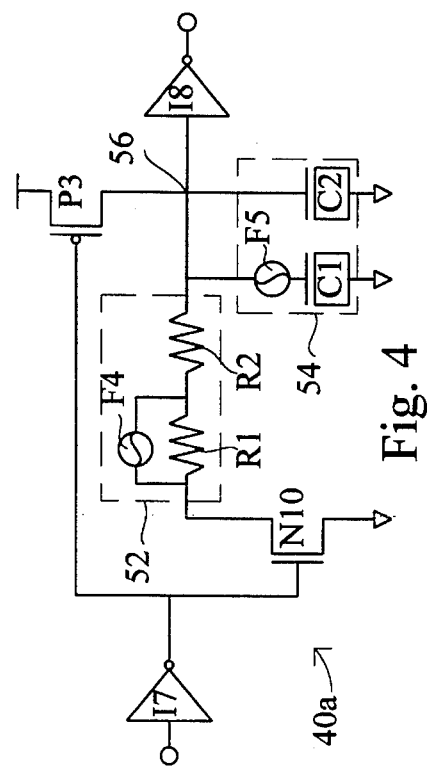
FIG. 4 is a schematic diagram illustrating the delay circuit according to the preferred embodiment of the present invention.

Referring now to FIG. 4, a schematic diagram of the first delay circuit 40a of the preferred embodiment is set forth. The first delay circuit 40a includes an input driver (I7) and an output driver (I8), a PMOS pull-up transistor (P3), an NMOS pull-down transistor (N10), an adjustable resistance element 52, and an adjustable capacitance element 54. The output of I7 is received by the gates of P3 and N10. N10 is coupled to a delay output node 56 through the resistance element 52 by its drain, and to ground by its source. P3 is coupled to the delay output node 56 by its drain, and to the positive power supply by its source. The capacitance element 54 is situated between the delay output node 56 and ground. In response to a low-to-high transition at the output of I7, P3 is turned off, N10 is turned on, and the capacitance element 54 discharges through the resistance element 52 and N10, creating a delayed, high-to-low transition at the delay output node 56. In response to a high-to-low transition at the output of I7, N10 is turned off, P3 is turned on, and the capacitance element 54 charges to a logic high, creating a delayed low-to-high transition at the delay output node 56. In this implementation, however, the edges of the signal received by the delay circuit 40a are pushed-out with more delay for the former transition.

In the preferred embodiment, both the capacitance element 54 and the resistance element 56 are adjustable. Referring once again to FIG. 4, it is shown that the resistance element 52 is composed of two series resistors (R1 and R2) with a fusible link (F4) in parallel with R1. Similarly, the capacitance element 54 is composed of two parallel capacitors (C1 and C2) with a fusible link (F5) in series with C1. C1 and C2 are created from NMOS devices. To adjust the overall delay of the delay circuit 40a, F4 and/or F5 can to opened to increase the resistance or decrease the capacitance, respectively. In the preferred embodiment, F4 and F5 are laser fusible links that are opened prior to packaging the device.

Accordingly, the preferred embodiment provides multiple internal timing adjustments both before and after the device is packaged. Before being packaged, the device can be probed, and by applying a supervoltage at the bond pads 30, the operation of the device can be observed for a number of internal timing signal (S0–S3) variations. Also, prior to packaging, the laser fusible links F1–F5 can be selectively opened to permanently alter the delay introduced by the delay circuits (40a–40d), to change the effective super voltage, or to disable the super voltage inputs. Once the device is packaged, the internal timing can be varied again, by applying a super voltage through package pins that are connected to the bond pads 30. In addition, test signatures provided by the present invention can be used to create subsequent metallization schemes that permanently set the delay of the timing adjust circuits to an optimal value.

It is understood that the invention has been described in connection with its preferred embodiments, and may be changed, and other embodiments derived, without departing from the spirit and scope of the invention. Accordingly, the above disclosure is not intended to be limiting and the appended claims are to be interpreted as encompassing the entire scope of the invention.

What we claim is:

1. In an integrated circuit having a plurality of timing pulse signals, a pulse width modulation circuit, comprising:

logic means for receiving a plurality of external signals and generating a plurality of control signal combinations therefrom;

a plurality of pulse width adjusting circuits, each said pulse width adjusting circuit receiving at least one timing pulse signal internal to the integrated circuit and at least one of said plurality of control signal combinations, and adjusting a width of the at least one timing pulse in response to its respective control signal; and a super voltage detect circuit, including a plurality of super voltage inputs and detect outputs, said super voltage detect circuit providing a particular combination of said plurality of external signals at the detect outputs in response to each combination of super voltages applied to its super voltage inputs, the detect outputs being coupled to said logic means.

2. The circuit of claim 1 wherein:

said logic means is a decoder.

3. The circuit of claim 1 wherein:

each said pulse width adjusting circuit includes at least one pulse widening subcircuit.

4. The circuit of claim 3 wherein:

the at least one pulse widening subcircuit includes an input node for receiving one of the timing pulse signals;

an output node for providing a widened output pulse;

delayed pull-up means coupled between the output node and a positive power supply, the delayed pull-up means being activated by the one timing pulse signal being at a first logic level at the input node; and delayed pull-down means coupled between the output node and a negative power supply, the delayed pull-down means being activated by the one timing pulse signal being at a second logic level at the input node.

5. The circuit of claim 4 wherein:

the delayed pull-up means includes a p-channel MOS transistor having its source coupled to a positive power supply, its gate coupled to the input node, and its drain coupled to the output node, and a capacitive unit between the output node and ground; and the delayed pull-down means includes an n-channel MOS transistor having its source coupled to ground, its gate coupled to the input node, and its drain coupled to the output node via a resistive unit, the resistive unit forming an RC combination with the capacitive element.

6. The circuit of claim 5 wherein:

the resistive unit is an adjustable unit including two resistance elements connected in series, and a fusible link in parallel with one of the resistance elements.

7. The circuit of claim 6 wherein:

the capacitive unit includes two parallel capacitance elements, and a fusible link in series with one of the capacitance elements.

8. The circuit of claim 3 wherein:

the pulse width adjusting circuit further includes the at least one pulse widening subcircuit having an output that is disabled in response to the control signal being at a first logic level; and a first passgate in parallel with the at least one pulse widening subcircuit, the first passgate having a passgate input and a passgate output, and allowing an input signal to pass therethrough in response to the control signal being at the first logic level; wherein the at least one pulse widening subcircuit and first passgate both receive the timing pulse as an input signal.

9. The circuit of claim 8 wherein:

the at least one pulse widening subcircuit output is a three state driver, the three state driver being placed in the third state by the control signal being at the first logic level, the output of the three state driver being coupled to the output of the passgate.

10. The circuit of claim 1 wherein:

at least one of said plurality of pulse width adjusting circuits receives two control signals and includes a first pulse widening subcircuit in series with a second pulse widening subcircuit, the first pulse widening subcircuit being enabled by a first control signal and disabled by a second control signal, the second pulse widening subcircuit being disabled by the first control signal and enabled by the second control signal.

11. The circuit of claim 1 wherein:

said super voltage detect circuit includes a plurality of load elements intermediate the super voltage inputs and detect outputs.

12. The circuit of claim 11 wherein:

said super voltage detect circuit includes fusible links in parallel with the load elements.

13. The circuit of claim 11 wherein:

the load elements are diode coupled NMOS transistors.

14. The circuit of claim 1 wherein:

said super voltage detect circuit includes a quiescent pull-down circuits coupled to the detect outputs for pulling the detect outputs to a low logic level when a voltage having a magnitude less than a predetermined super voltage is present at the super voltage inputs.

15. The circuit of claim 14 wherein:

the quiescent pull-down circuits each include two load elements connected in series between the positive power supply and one of the detect outputs, and an n-channel MOS transistor having its drain coupled the detect output, its gate coupled to the positive power supply, and its source coupled to ground.

16. The circuit of claim 1 wherein:

said super voltage detect circuit includes disable means for maintaining selected detect outputs at one logic level regardless of the voltage levels at the super voltage inputs.

17. The circuit of claim 16 wherein:

the disable means includes quiescent pull-down circuits intermediate fusible links and the detect outputs.

18. The circuit of claim 1 wherein:

the super voltage inputs are bond pads on the integrated circuit.

19. The circuit of claim 18 wherein:

the integrated circuit includes at least one input/output circuit; and the bond pads are dual function bond pads, providing inputs to both said super voltage detect circuit and to the input/output circuit.

20. In a semiconductor device having a plurality of timing pulses, a timing pulse width adjusting circuit, comprising:

a supervoltage detect means responsive to a plurality of supervoltage input combinations for generating a selected first and second control signal combination in response thereto;

for each timing pulse, an input node for receiving the timing pulse;

a first multiplexing means (MUX) having at least two inputs and at least one output, said first MUX coupling a selected one of its inputs to its output in response to the first control signal;

a first adjustable delay circuit coupled intermediate said input node and one of the first MUX inputs;

a first signal path coupled intermediate said input node and another of the first MUX inputs;

a second MUX having at least two inputs and at least one output, said second MUX coupling a selected one of its inputs to its output in response to the second control signal;

a second adjustable delay circuit coupled intermediate the first MUX output and one of the second MUX inputs; and a second signal path coupled intermediate said first MUX output and another of the second MUX inputs;

wherein each combination of supervoltage inputs results in a different timing variation of the plurality of timing pulses of the semiconductor device.

21. The circuit of claim 20 wherein:

at least one of the MUXs includes a first gate means having a first gate input and a first gate output, the first gate input being coupled to the first signal path, the first gate means allowing a signal to pass therethrough when the first control signal is at a first logic level; and a second gate means having a second gate input and a second gate output, the second gate input being coupled to the first adjustable delay circuit, the second gate means allowing a signal to pass therethrough when the first control signal is at second logic level, the first gate output and the second gate output being coupled together to form the MUX output.

22. The circuit of claim 21 wherein:

at least one of the gate means is a tri-state driver.

23. The circuit of claim 21 wherein:

at least one of the gate means is a CMOS passgate.

* * * * *